US012588391B2

(12) United States Patent
Zhang

(10) Patent No.: US 12,588,391 B2
(45) Date of Patent: Mar. 24, 2026

(54) OLED DISPLAY PANEL AND METHOD OF FABRICATING OLED DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Qianyi Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 476 days.

(21) Appl. No.: 17/754,948

(22) PCT Filed: Apr. 12, 2022

(86) PCT No.: PCT/CN2022/086361
§ 371 (c)(1),
(2) Date: Apr. 17, 2022

(87) PCT Pub. No.: WO2023/184569
PCT Pub. Date: Oct. 5, 2023

(65) Prior Publication Data
US 2024/0155912 A1     May 9, 2024

(30) Foreign Application Priority Data

Mar. 31, 2022     (CN) .......................... 202210337127.7

(51) Int. Cl.
*H10K 59/80*     (2023.01)
*H10K 59/12*     (2023.01)
*H10K 59/122*     (2023.01)

(52) U.S. Cl.
CPC ... *H10K 59/80522* (2023.02); *H10K 59/1201* (2023.02); *H10K 59/122* (2023.02); *H10K 59/80521* (2023.02)

(58) Field of Classification Search
CPC ................................................. H10K 59/80522
See application file for complete search history.

(56) References Cited

U.S. PATENT DOCUMENTS

2014/0346453 A1* 11/2014 Koo ..................... H10K 50/813
                                                                438/34
2016/0211316 A1* 7/2016 Oh ................... H10K 59/80522
                        (Continued)

FOREIGN PATENT DOCUMENTS

CN        103311265 A      9/2013
CN        108172605 A      6/2018
                 (Continued)

OTHER PUBLICATIONS

International Search Report in International application No. PCT/CN2022/086361, mailed on Dec. 16, 2022.
(Continued)

*Primary Examiner* — Erik Kielin
(74) *Attorney, Agent, or Firm* — PV IP PC; Christopher S. Ruprecht; Wei Te Chung

(57)     ABSTRACT

An organic light-emitting diode (OLED) display panel and a method of fabricating the OLED display panel are provided. By providing a gap between a first electrode and an inner wall of the first opening, an organic light-emitting material will only flow into the gap between the first electrode and the inner wall of the first opening through the first opening. In this way, it is difficult for the organic light-emitting material to be sputtered on a contact surface between the first electrode and a cathode, so that display uniformity is enhanced.

14 Claims, 5 Drawing Sheets

(56) References Cited

U.S. PATENT DOCUMENTS

| | | | | |
|---|---|---|---|---|
| 2017/0125507 | A1 | 5/2017 | Lee et al. | |
| 2017/0278919 | A1* | 9/2017 | Matsumi | H10K 59/80522 |
| 2019/0115561 | A1 | 4/2019 | Tang et al. | |
| 2020/0127225 | A1* | 4/2020 | Zhang | H10K 59/80522 |
| 2021/0376283 | A1* | 12/2021 | Shin | H10K 59/123 |
| 2022/0037616 | A1* | 2/2022 | Liu | H10K 59/80522 |
| 2022/0209170 | A1* | 6/2022 | Kang | H10K 59/80522 |
| 2023/0157082 | A1* | 5/2023 | Choi | H10K 50/15 257/40 |
| 2023/0413618 | A1* | 12/2023 | Fang | H10K 59/88 |
| 2024/0008343 | A1* | 1/2024 | Guo | H10K 71/621 |
| 2024/0164179 | A1* | 5/2024 | Zhang | H10K 59/1201 |
| 2024/0172525 | A1* | 5/2024 | Zhang | H10K 59/1201 |

FOREIGN PATENT DOCUMENTS

| | | | |
|---|---|---|---|
| CN | 109103215 | A | 12/2018 |
| CN | 109560117 | A | 4/2019 |
| CN | 110061145 | A | 7/2019 |
| CN | 110224005 | A | 9/2019 |
| CN | 111969034 | A | 11/2020 |
| CN | 112038506 | A | 12/2020 |
| CN | 113097416 | A | 7/2021 |
| CN | 113193025 | A | 7/2021 |
| CN | 113224254 | A | 8/2021 |
| CN | 113327937 | A | 8/2021 |

OTHER PUBLICATIONS

Written Opinion of the International Search Authority in International application No. PCT/CN2022/086361, mailed on Dec. 16, 2022.

Chinese Office Action issued in corresponding Chinese Patent Application No. 202210337127.7 dated Aug. 1, 2024, pp. 1-6.

Chinese Office Action issued in corresponding Chinese Patent Application No. 202210337127.7 dated Mar. 29, 2025. pp. 1-9.

* cited by examiner

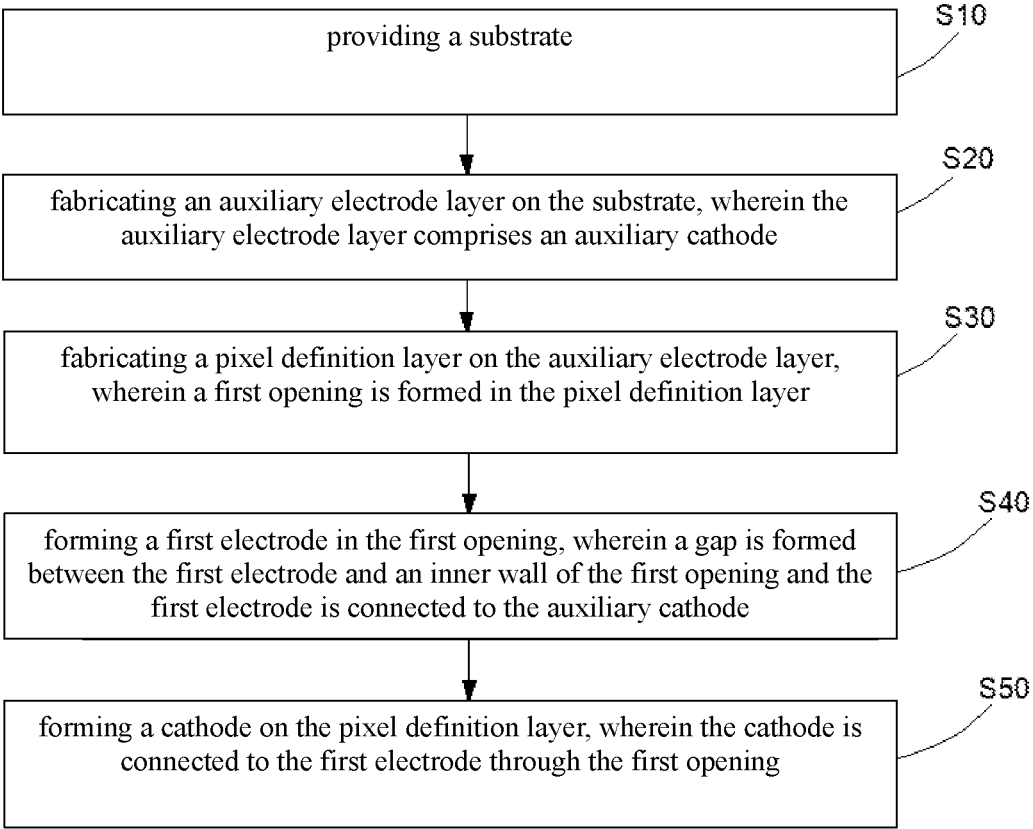

| providing a substrate | S10 |

| fabricating an auxiliary electrode layer on the substrate, wherein the auxiliary electrode layer comprises an auxiliary cathode | S20 |

| fabricating a pixel definition layer on the auxiliary electrode layer, wherein a first opening is formed in the pixel definition layer | S30 |

| forming a first electrode in the first opening, wherein a gap is formed between the first electrode and an inner wall of the first opening and the first electrode is connected to the auxiliary cathode | S40 |

| forming a cathode on the pixel definition layer, wherein the cathode is connected to the first electrode through the first opening | S50 |

FIG. 3

OLED DISPLAY PANEL AND METHOD OF FABRICATING OLED DISPLAY PANEL

BACKGROUND OF INVENTION

1. Field of Invention

The present application relates to a technical field of displays, and particularly to an organic light-emitting diode (OLED) display panel and a method of fabricating the OLED display panel.

2. Related Art

Current organic light-emitting diode (OLED) display panels including thin-film transistor (TFT) substrates including TFT driving circuits, and a plurality of OLED devices disposed on the TFT substrates. The OLED devices generally include anodes disposed on TFT substrates, organic light-emitting layers disposed on the anodes, and cathodes disposed on the organic light-emitting layers. The light-emitting principle of OLED devices is that organic light-emitting materials emit light through carrier injection and recombination driven by an electric field.

Specifically, OLED display panels are applied to large-sized high-resolution display panels due to their high aperture ratios. However, cathodes of OLED devices are generally prepared with thin layers of metallic silver, which have high resistivity, causing large voltage drops and great differences between actual driving voltages and power supply voltages of the TFT substrates. On large-sized OLED display panels, brightness is uneven in large areas, thus adversely affecting display performance.

In order to solve the problem that voltage drop of the large-sized OLED display panels is relatively large, contact improved areas are provided in non-display areas in prior art. The voltage drop is improved by adding improved electrodes connected to cathodes of the OLED devices in the contact improved areas, and the organic light-emitting layers are arranged between the cathodes of the OLED devices and the improvement electrodes. During a process of forming the organic light-emitting layers by inkjet printing, organic light-emitting materials of the organic light-emitting layers will overflow to other positions of the display panels. In addition, conductivity of the organic light-emitting materials is poor, and the organic light-emitting materials are often sputtered downward on the improved electrodes after overflowing. As a result, organic layers tend to be formed in the contact improved areas, which leads to poor contact between the improved electrodes and the cathodes of the OLED devices, and affecting the uniformity of the display performance of the display panels.

SUMMARY OF INVENTION

The present application provides an organic light-emitting diode (OLED) display panel and a method of fabricating the OLED display panel to improve display uniformity of a display panel.

The present application provides an organic light-emitting diode (OLED) display panel, including a substrate; an auxiliary electrode layer disposed on the substrate and comprising an auxiliary cathode; a pixel definition layer disposed on the auxiliary electrode layer and provided with a first opening; a first electrode disposed in the first opening, and a gap located between the first electrode and the first opening, wherein the first electrode is connected to the auxiliary cathode; and a cathode disposed on the pixel definition layer and connected to the first electrode through the first opening.

Optionally, in some embodiments of the present application, the OLED display panel further includes a planarization layer disposed on the auxiliary electrode layer. The pixel definition layer is located on the planarization layer, a second opening is located in the planarization layer and communicates with the first opening, the first electrode is disposed in the first opening and the second opening, and the cathode is connected to the first electrode through the first opening and the second opening.

Optionally, in some embodiments of the present application, the gap extends between the first electrode and an inner wall of the second opening.

Optionally, in some embodiments of the present application, the first electrode is plural in number, and a plurality of the first electrodes are spaced apart from each other.

Optionally, in some embodiments of the present application, the auxiliary cathode is one in number and is connected to the plurality of the first electrodes.

Optionally, in some embodiments of the present application, the auxiliary cathode includes a connecting surface defining a plurality of grooves, and one end of each of the first electrodes is disposed in a corresponding one of the grooves.

Optionally, in some embodiments of the present application, the auxiliary cathode is plural in number, and the auxiliary cathodes are connected to the first electrodes in a one-to-one correspondence. One end of each of the auxiliary cathodes protrudes into the first opening, and a corresponding one of the first electrodes encompasses the one end of the auxiliary cathode.

Optionally, in some embodiments of the present application, the auxiliary cathode has a cross section having a homocentric squares-shaped structure, a U-shaped structure, an L-shaped structure, an S-shaped structure, or an O-shaped structure in a thickness direction.

Optionally, in some embodiments of the present application, the first electrode and the auxiliary cathode have a same cross-sectional shape in the thickness direction.

Correspondingly, the present application further provides a method of fabricating an OLED display panel, including providing a substrate; fabricating an auxiliary electrode layer on the substrate, wherein the auxiliary electrode layer comprises an auxiliary cathode; fabricating a pixel definition layer on the auxiliary electrode layer, wherein a first opening is formed in the pixel definition layer; forming a first electrode in the first opening, wherein a gap is formed between the first electrode and an inner wall of the first opening and the first electrode is connected to the auxiliary cathode; and forming a cathode on the pixel definition layer, wherein the cathode is connected to the first electrode through the first opening.

Correspondingly, the present application further provides an OLED display panel, including a substrate; an auxiliary electrode layer disposed on the substrate and comprising an auxiliary cathode; a pixel definition layer disposed on the auxiliary electrode layer and provided with a first opening; a first electrode disposed in the first opening, and a gap located between the first electrode and the first opening, wherein the first electrode is connected to the auxiliary cathode; and a cathode disposed on the pixel definition layer and connected to the first electrode through the first opening. A height of the first electrode is greater than or equal to 20 nanometers.

Optionally, in some embodiments of the present application, the OLED display panel further includes a planarization layer disposed on the auxiliary electrode layer, wherein the pixel definition layer is located on the planarization layer, a second opening is located in the planarization layer and communicates with the first opening, the first electrode is disposed in the first opening and the second opening, and the cathode is connected to the first electrode through the first opening and the second opening.

Optionally, in some embodiments of the present application, the gap extends between the first electrode and an inner wall of the second opening.

Optionally, in some embodiments of the present application, the first electrode is plural in number, and a plurality of the first electrodes are spaced apart from each other.

Optionally, in some embodiments of the present application, the auxiliary cathode is one in number and is connected to the plurality of the first electrodes.

Optionally, in some embodiments of the present application, the auxiliary cathode includes a connecting surface defining a plurality of grooves, and one end of each of the first electrodes is disposed in a corresponding one of the grooves.

Optionally, in some embodiments of the present application, the auxiliary cathode is plural in number, and the auxiliary cathodes are connected to the first electrodes in a one-to-one correspondence. One end of each of the auxiliary cathodes protrudes into the first opening, and a corresponding one of the first electrodes encompasses the one end of the auxiliary cathode.

Optionally, in some embodiments of the present application, the auxiliary cathode has a cross section having a homocentric squares-shaped structure, a U-shaped structure, an L-shaped structure, an S-shaped structure, or an O-shaped structure in a thickness direction.

Optionally, in some embodiments of the present application, the first electrode and the auxiliary cathode have a same cross-sectional shape in the thickness direction.

Optionally, in some embodiments of the present application, the OLED display panel further includes an anode and an organic light-emitting layer, wherein a third opening is located in the pixel definition layer, the anode is disposed in the third opening, the organic light-emitting layer is disposed on the anode, and the cathode is connected to the organic light-emitting layer through the third opening.

The present application has advantageous effects as follows: the present application provides the OLED display panel and the method of fabricating the OLED display panel. The OLED display panel includes the substrate, the auxiliary electrode layer disposed on the substrate and including the auxiliary cathode, the pixel definition layer disposed on the auxiliary electrode layer and defining a first opening, a first electrode disposed in the first opening, the gap located between the first electrode and the inner wall of the first opening, the first electrode connected to the auxiliary cathode, and the cathode disposed on the pixel definition layer and connected to the first electrode through the first opening. In the present application, the first opening is formed in the pixel definition layer, the first electrode is disposed in the first opening, and the gap is formed between the first electrode and the inner wall of the first opening. Therefore, in a process of forming the organic light-emitting layer by inkjet printing, an organic light-emitting material of the organic light-emitting layer will only flow into the gap between the first electrode and the inner wall of the first opening through the first opening after overflowing. It is difficult for the organic light-emitting material of the organic light-emitting layer to be sputtered on a contact surface of the first electrode and the cathode. In addition, the cathode is connected to the first electrode through the first opening, so that no organic light-emitting layer will be formed between the first electrode and the cathode. In this way, the first electrode and the cathode can maintain a good contact between each other, thus improving voltage drop of the cathode and enhancing display uniformity.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

FIG. 3 is a flowchart of a method of fabricating an OLED display panel provided by the present application.

DESCRIPTION OF PREFERRED EMBODIMENTS

Figure 1:
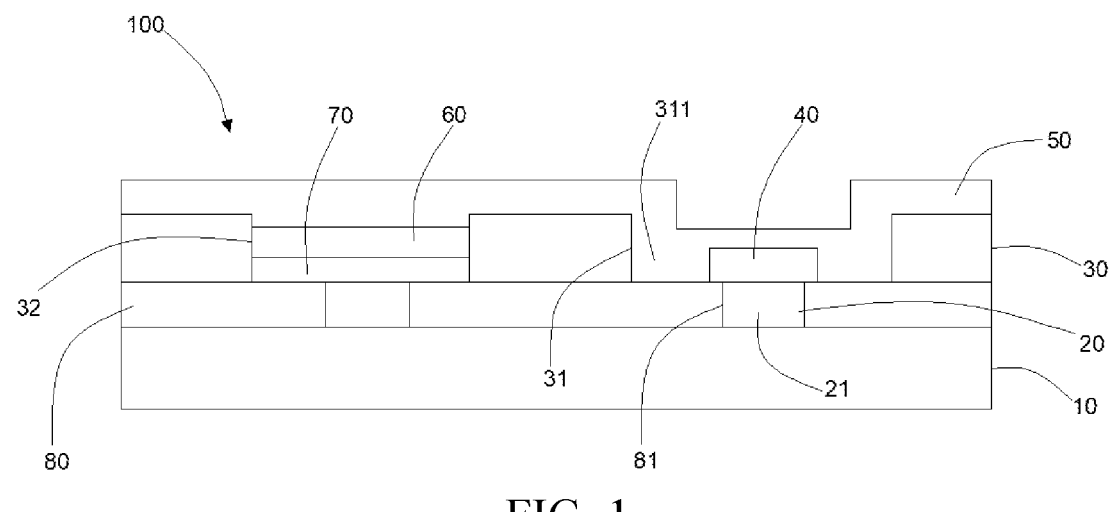
FIG. 1 is a first schematic structural view of an organic light-emitting diode (OLED) display panel provided by the present application.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

In the description of the present application, it is to be understood that the orientation or the positional relationship indicated by the terms "center", "length", "width", "upper", "lower", "front", "rear", "left", "right", "inner", "outer", etc., is based on the orientation or the positional relationship shown in the drawings only for ease of describing and simplifying the present application, and is not intended to indicate or imply that the device or element referred to must have a particular orientation in a particular orientation construction and operation, and therefore should not be construed as limiting the present application. In addition, the terms "first" and "second" are only used for descriptive purposes and are not to be construed as indicating or implying relative importance. Thus, features defining "first" or "second" may include one or more of the described features either explicitly or implicitly. In the description of the present invention, the meaning of "a plurality" is two or more unless specifically and specifically defined otherwise.

The present application provides an organic light-emitting diode (OLED) display panel 100 and a method for fabricating the OLED display panel 100, which will be described in detail below. It should be noted that the description order of the following embodiments is not intended to limit the preferred order of the embodiments of the present application.

Please refer to FIG. 1, which is a first schematic structural view of the OLED display panel 100 provided by the present application. The present application provides the OLED display panel 100, including a substrate 10, an auxiliary electrode layer 20, a pixel definition layer 30, a first electrode 40, and a cathode 50.

The substrate 10 may include a single-layered flexible organic layer or a two-layered or more than two-layered flexible organic layer. The flexible organic layer is made of a material including one or a combination of polyimide, polyethylene naphthalate, polyethylene terephthalate, polyarylate, polycarbonate, polyetherimide, polyethersulfone, or the like.

The auxiliary electrode layer 20 is disposed on the substrate 10 and includes an auxiliary cathode 21; a material of the auxiliary electrode layer 20 includes at least one of copper, molybdenum titanium, molybdenum, or indium tin oxide.

The pixel definition layer 30 is disposed on the auxiliary electrode layer 20 and defines a first opening 31. The pixel definition layer 30 is made of an organic material selected from epoxy, polyimide, polyethylene terephthalate, polycarbonate, polyethylene, polyacrylate, or the like.

The first electrode 40 is disposed in the first opening 31. A gap 311 is located between the first electrode 40 and an inner wall of the first opening 31. The first electrode 40 is connected to the auxiliary cathode 21. The cathode 50 is disposed on the pixel definition layer 30 and is connected to the first electrode 40 through the first opening 31.

Specifically, the first electrode 40 is made of a material including at least one of indium zinc oxide, indium tin oxide, silver, silver alloy, aluminum, or aluminum alloy. A material of the cathode 50 includes a transparent oxide with high resistivity.

In the present application, the first opening 31 is formed by the pixel definition layer 30, the first electrode 40 is disposed in the first opening 31, and the gap 311 is formed between the first electrode 40 and the inner wall of the first opening 31. Therefore, in a process of forming the organic light-emitting layer by inkjet printing, an organic light-emitting material of the organic light-emitting layer will only flow into the gap 311 between the first electrode 40 and the inner wall of the first opening 31 through the first opening 31 after overflowing. It is difficult for the organic light-emitting material of the organic light-emitting layer to be sputtered on a contact surface of the first electrode 40 and the cathode 50. In addition, the cathode 50 is connected to the first electrode 40 through the first opening 31, so that no organic light-emitting layer will be formed between the first electrode 40 and the cathode 50. In this way, the organic light-emitting layer does not affect the connection between the first electrode 40 and the cathode 50, so that the first electrode 40 and the cathode 50 can maintain a good contact between each other, thus improving voltage drop of the cathode 50 and enhancing display uniformity.

The OLED display panel 100 further includes a passivation layer 80 disposed on the substrate 10. The passivation layer 80 defines a through hole 81, and the auxiliary cathode 21 is disposed in the through hole 81. The passivation layer 80 converts a metal surface of the substrate 10 into a state that is not easily oxidized, thereby slowing down the corrosion rate. The passivation layer 80 includes an inorganic layer or an organic layer. The inorganic layer may be made of a material including aluminum oxide, silicon oxide, silicon nitride, silicon oxynitride, silicon carbide, titanium oxide, zirconium oxide, zinc oxide, or the like. The organic layer may be made of a material including epoxy resin, polyimide, polyethylene terephthalate, polycarbonate, polyethylene, polyacrylate, etc.

The OLED display panel 100 further includes an anode 70 and an organic light-emitting layer 60. A third opening 32 is located in the pixel definition layer 30, the anode 70 is disposed in the third opening 32, the organic light-emitting layer 60 is disposed on the anode 70, a plurality of OLED devices are arranged in an array, and the cathode 50 is connected to the organic light-emitting layer 60 through the third opening 32. Each of the OLED devices may also include a hole injection layer, a hole transport layer, an electron transport layer, an electron injection layers, and the like. The OLED device used in the present application may be a top emission type OLED device or a bottom emission type OLED device.

In addition, in some embodiments, a height of the first electrode 40 is greater than or equal to 20 nanometers. In this way, a sufficiently large gap can be ensured between the first electrode 40 and the inner wall of the first opening 31, and the gap can accommodate a sufficient amount of the organic light-emitting material of the organic light-emitting layer.

Figure 2:
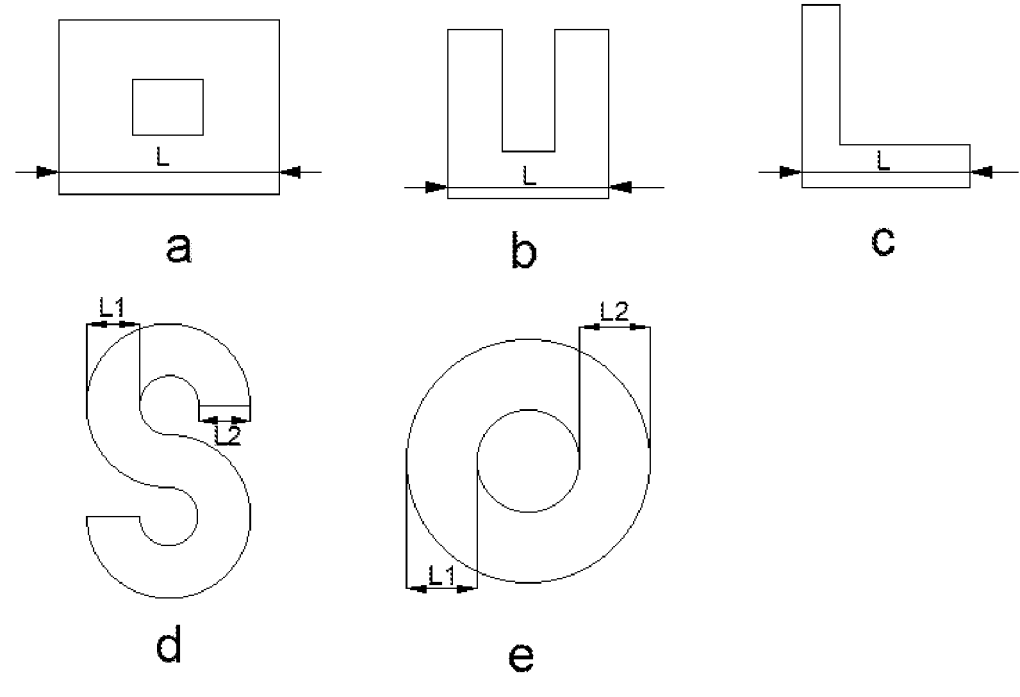
FIG. 2 is a schematic cross-sectional view of an auxiliary cathode of the OLED display panel provided by the present application.

Further, please refer to FIG. 2, which is a schematic cross-sectional view of the auxiliary cathode 21 of the OLED display panel provided by the present application. FIG. 2 shows shapes of the cross section in a thickness direction of the auxiliary cathode with a total of five structures a, b, c, d, and e. In some embodiments, the auxiliary cathode 21 has a cross section having a homocentric squares-shaped structure, a U-shaped structure, an L-shaped structure, an S-shaped structure, or an O-shaped structure in the thickness direction. A width of the auxiliary cathode 21 is 3 microns (μm) to 5 μm, the first electrode 40 overlaps the auxiliary cathode 21, and a width of a contact portion between the first electrode 40 and the auxiliary cathode 21 is not less than 3 microns. In this way, good contact conductivity can be ensured between the first electrode 40 and the auxiliary cathode 21. For example, when the first electrode 40 covers the auxiliary cathode 21 and the cross section of the auxiliary cathode 21 is the homocentric squares-shaped structure, the U-shaped structure, or the L-shaped structure, the first electrode 40 overlaps the auxiliary cathode 21, and a maximum width of the contact portion is L. At this time, L is not less than 3 microns. For example, when the first electrode 40 covers the auxiliary cathode 21 and the cross section of the auxiliary cathode 21 is the S-shaped structure or the O-shaped structure, the first electrode 40 overlaps the auxiliary cathode 21, and the maximum width of the contact portion is a sum of a width L1 of a first contact portion and a width L2 of a second contact portion. At this time, the sum of L1 and L2 is not less than 3 microns.

Figure 4:
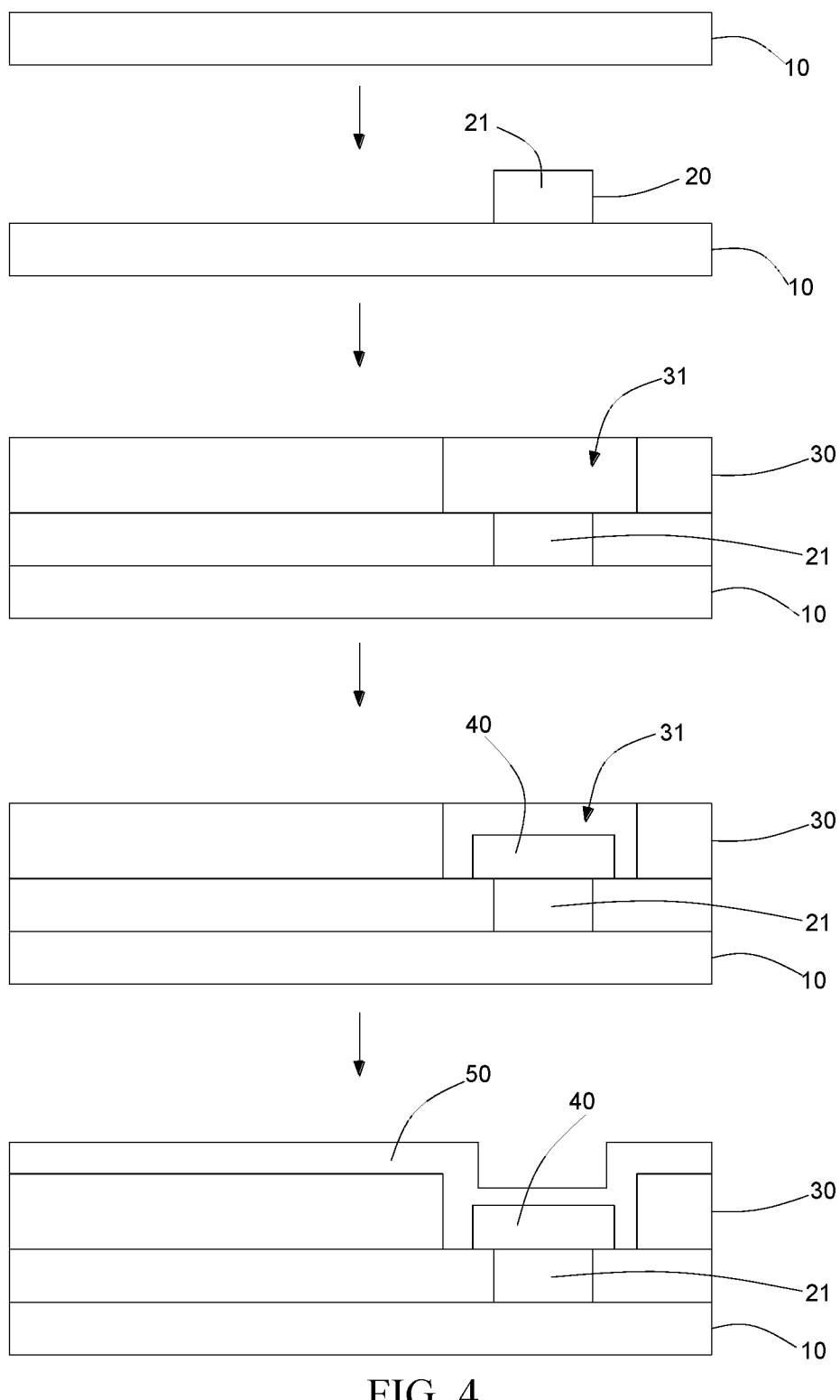
FIG. 4 is a process view showing fabrication of the OLED display panel of the present application.

Please refer to FIGS. 3 and 4. FIG. 3 is a flowchart of a method of fabricating the OLED display panel 100 provided by the present application. FIG. 4 is a process view showing the fabrication of the OLED display panel 100 of the present application. The present application further provides the method of fabricating the OLED display panel 100, including the following steps:

Step S10: providing a substrate 10. The substrate 10 may include a single-layered flexible organic layer or a two-layered or more than two-layered flexible organic layer. The flexible organic layer is made of a material including one or a combination of polyimide, polyethylene naphthalate, polyethylene terephthalate, polyarylate, polycarbonate, polyetherimide, or polyethersulfone. The substrate 10 functions as a base substrate.

Step S20: forming an auxiliary electrode layer 20 on the substrate 10. The auxiliary electrode layer 20 includes an auxiliary cathode 21. A material of the auxiliary electrode layer 20 includes at least one of copper, molybdenum titanium, molybdenum, or indium tin oxide.

Step S30: forming a pixel definition layer 30 on the auxiliary electrode layer 20. The pixel definition layer 30 forms a first opening 31. The pixel definition layer 30 is made of an organic material selected from epoxy, polyimide, polyethylene terephthalate, polycarbonate, polyethylene, polyacrylate, or the like. The first opening 31 exposes the auxiliary cathode 21.

Step S40: forming a first electrode 40 in the first opening 31. A gap 311 is formed between the first electrode 40 and an inner wall of the first opening 31, and the first electrode 40 is connected to the auxiliary cathode 21. The first electrode 40 is made of a material including at least one of indium zinc oxide, indium tin oxide, silver, silver alloy, aluminum, or aluminum alloy.

Step S50: forming a cathode 50 on the pixel definition layer 30. The cathode 50 is connected to the first electrode 40 through the first opening 31. A material of the cathode 50 includes a transparent oxide with high resistivity.

In the present application, the first opening 31 is formed by the pixel definition layer 30, the first electrode 40 is disposed in the first opening 31, and the gap 311 is formed between the first electrode 40 and the inner wall of the first opening 31. Therefore, in a process of forming the organic light-emitting layer by inkjet printing, an organic light-emitting material of the organic light-emitting layer will only flow into the gap 311 between the first electrode 40 and the inner wall of the first opening 31 through the first opening 31 after overflowing. It is difficult for the organic light-emitting material of the organic light-emitting layer to be sputtered on a contact surface of the first electrode 40 and the cathode 50. In addition, the cathode 50 is connected to the first electrode 40 through the first opening 31, so that no organic light-emitting layer will be formed between the first electrode 40 and the cathode 50. In this way, the organic light-emitting layer does not affect the connection between the first electrode 40 and the cathode 50, so that the first electrode 40 and the cathode 50 can maintain a good contact between each other, thus improving voltage drop of the cathode 50 and enhancing display uniformity.

Figure 5:
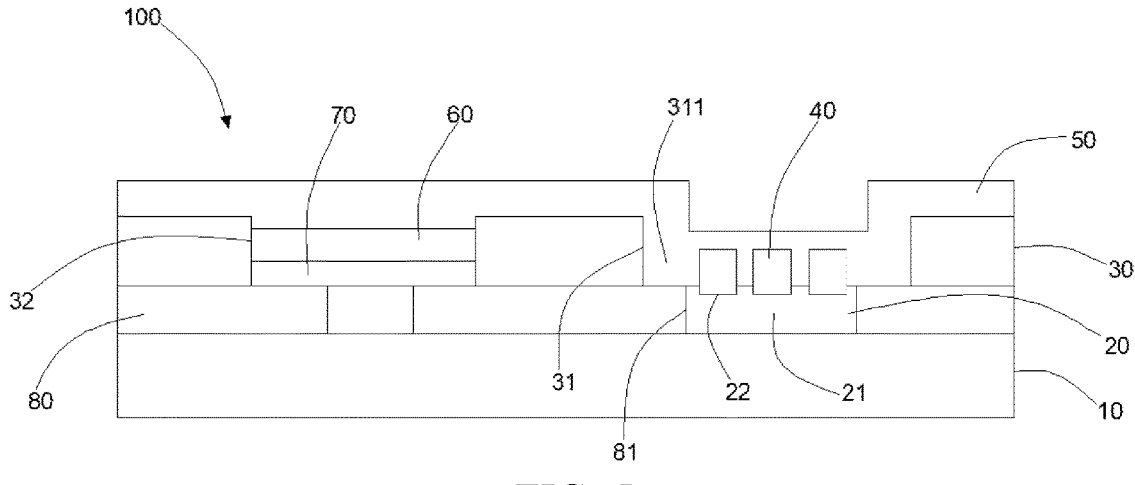
FIG. 5 is a second schematic structural view of an OLED display panel provided by the present application.

Please refer to FIG. 5, which is a second schematic structural view of the OLED display panel 100 provided by the present application. This embodiment is different from the OLED display panel 100 provided in FIG. 1 in that the first electrodes 40 is plural in number, and a plurality of the first electrodes 40 are spaced apart from each other. Specifically, the first electrodes 40 are arranged in an array.

In the present application, the first electrodes 40 are arranged at intervals, so that an accommodating space for accommodating the organic light-emitting material of the organic light-emitting layer includes not only a space between the first electrode 40 and the inner wall of the first opening 31, but also a plurality of spaces between the first electrodes 40, thus increasing a capacity of the accommodation space for accommodating the organic light-emitting material. The organic light-emitting material of the organic light-emitting layer is filled in the gaps 311 between the first electrodes 40 and between the first electrodes 40 and the inner wall of the first opening 31, thereby further preventing the organic light-emitting material of the organic light-emitting layer from being sputtered onto a contact surface between the first electrode 40 and the cathode 50 in the process of forming the organic light-emitting layer by inkjet printing.

As can be seen from the above, an accommodating space not only can be adjusted by a size of the gap between the first electrode 40 and the inner wall of the first opening 31, but also by a distance between adjacent first electrodes 40, so that the organic light-emitting material of the organic light-emitting layer is always located at a lower position relative to the first electrodes 40, thereby preventing the organic light-emitting layer from affecting a contact effect between the first electrode 40 and the cathode 50.

In some embodiments, a number of auxiliary cathodes 21 is one, and a number of first electrodes 40 is plural. The one auxiliary cathodes 21 is connected to the first electrodes 40, which can reduce production time and improve production efficiency. Further, the auxiliary cathode 21 includes a connecting surface forming a plurality of grooves 22, and one end of each of the first electrodes 40 is disposed in a corresponding one of the grooves 22. By providing the grooves 22, a contact area between the first electrodes 40 and the auxiliary cathode 21 can be increased, and the connection stability of the first electrodes 40 and the auxiliary cathode 21 can be improved. Specifically, in some embodiments, the auxiliary cathode 21 and the passivation layer 80 remain flush. In other embodiments of this application, one end of the auxiliary cathode 21 may also protrude into the first opening 31 relative to the passivation layer 80, and the gap 311 is further formed between the auxiliary cathode 21 and the inner wall of the first opening 31, so that a depth of the gap 311 can be further increased.

Figure 6:
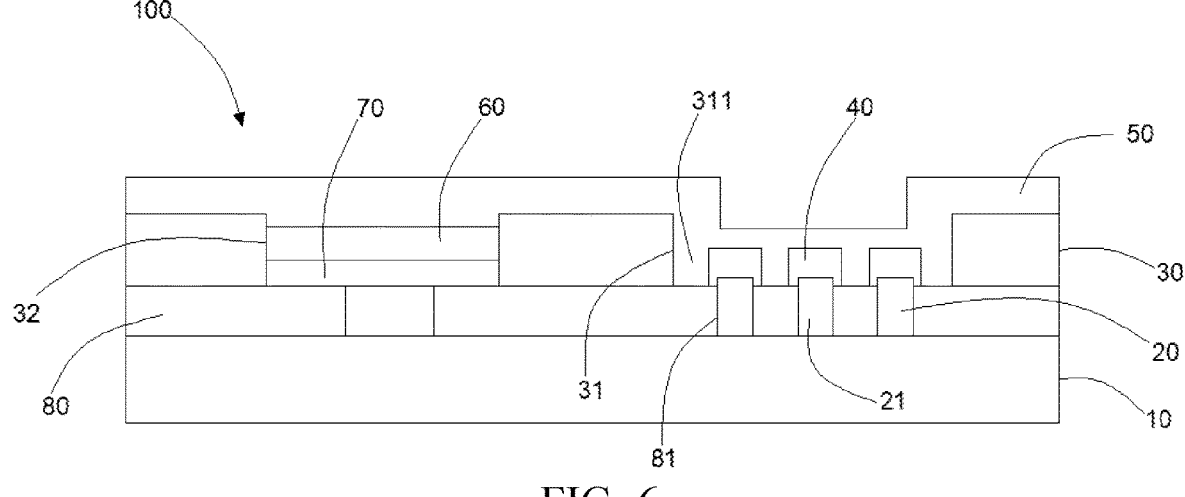
FIG. 6 is a third schematic structural view of an OLED display panel provided by the present application.

Please refer to FIG. 6, which is a third schematic structural view of the OLED display panel 100 provided by the present application. This embodiment is different from the OLED display panel 100 shown in FIG. 5 in that the auxiliary cathode 21 is plural in number, and the auxiliary cathodes 21 are connected to the first electrodes 40 in a one-to-one correspondence. One end of each of the auxiliary cathodes 21 protrudes into the first opening 31, and a corresponding one of the first electrodes 40 encompasses the one end of the auxiliary cathode 21.

By providing the auxiliary cathodes 21 connected to the first electrodes 40 in a one-to-one correspondence, and the first electrodes 40 encompass ends of the auxiliary cathodes 21, respectively, the present application can increase a contact area between the first electrodes 40 and the auxiliary cathodes 21, thereby improving the connection stability between the first electrodes 40 and the auxiliary cathodes 21, and increasing the accommodating space for accommodating the organic light-emitting material of the organic light-emitting layer.

Specifically, in some embodiments, one end of the auxiliary cathode 21 protrudes into the first opening 31 relative to the passivation layer 80. Certainly, in other embodiments of the present application, one end of the auxiliary cathode 21 is flush with the passivation layer 80.

In some embodiments, a width of the auxiliary cathodes 21 is 3 μm to 5 μm, and the distance between the adjacent auxiliary cathodes 21 is 4 μm to 5 μm. A height of the auxiliary cathode 21 is greater than or equal to 85 nanometers.

Further, in some embodiments, cross-sectional shapes of the first electrode 40 and the auxiliary cathode 21 in the thickness direction are the same. A same cross-sectional shape of the first electrode 40 and the auxiliary cathode 21 can ensure that the first electrode 40 and the auxiliary cathode 21 are in sufficient contact, thereby increasing the contact area.

Figure 7:
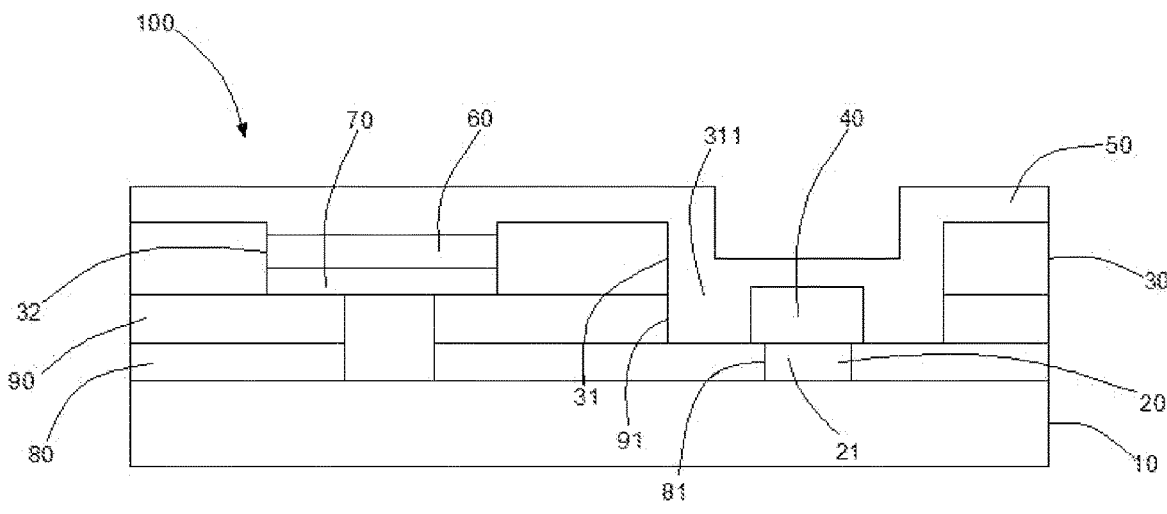
FIG. 7 is a fourth schematic structural view of an OLED display panel provided by the present application.

Please refer to FIG. 7, which is a fourth schematic structural view of the OLED display panel 100 provided by the present application. This embodiment is different from the OLED display panel 100 shown in FIG. 1 in that the OLED display panel 100 further includes a planarization layer 90 disposed on the auxiliary electrode layer 20, the pixel definition layer 30 is located on the planarization layer 90, a second opening 91 is formed in the planarization layer 90 and communicates with the first opening 31, the first electrode 40 is disposed in the first opening 31 and the second opening 91, and the cathode 50 is connected to the first electrode 40 through the first opening 31 and the second opening 91.

In the present application, by providing the second opening 91 communicating with the first opening 31, a depth of the opening can be increased, thereby increasing a design space of the first electrode 40 and reducing a thickness of the display panel.

In some embodiments, the gap 311 extends between first electrode 40 and an inner wall of the second opening 91.

In the present application, by providing the gap 311 between the first electrode 40 and the inner wall of the second opening 91, a volume of the gap 311 between the first electrode 40 and the inner wall of the opening can be further increased, that is, the gap 311 between the first electrode 40 and the inner wall of the opening can accommodate a greater amount of the organic light-emitting material of the organic light-emitting layer. Thus, the organic light-emitting material of the organic light-emitting layer being sputtered onto the first electrode 40 is further prevented in a formation process of the organic light-emitting layer.

Figure 8:
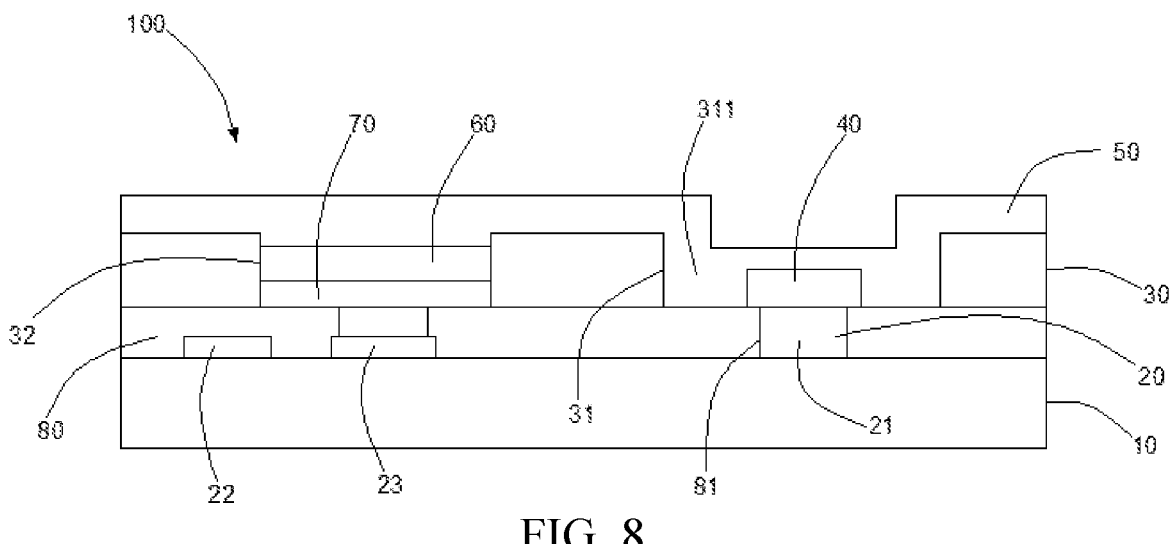
FIG. 8 is a fifth schematic structural view of an OLED display panel provided by the present application.

Please refer to FIG. 8, which is a fifth schematic structural view of the OLED display panel 100 provided by the present application. This embodiment is different from the OLED display panel 100 provided in FIG. 1 in that the auxiliary electrode layer 20 further includes a source electrode 22 and a drain electrode 23 of a thin-film transistor. The auxiliary electrode layer 20 further includes a source electrode 22 and a drain electrode 23 of the thin-film transistor. In addition, the source electrode 22 and the drain electrode 23 of the thin-film transistor are insulated from the auxiliary cathode electrode 21. The drain 23 of the thin-film transistor is connected to the anode 70.

By arranging the source electrode 22 and the drain electrode 23 of the thin-film transistor and the auxiliary cathode 21 on the auxiliary electrode layer 20 at a same time, that is, the auxiliary cathode 21 is formed at the same time as the source electrode 22 and the drain electrode 23 of the thin-film transistor are formed, photolithography processes can be reduced, and there is no need to add a new film layer structure or film layer material.

The above describes in detail the OLED display panel and the method for fabricating the OLED display panel provided by the embodiments of the present application. Specific examples are used in this article to illustrate the principles and implementation of the application, and the descriptions of the above examples are only used to help understand the methods and core ideas of the application; In addition, for those skilled in the art, according to the idea of the application, there will be changes in the specific implementation and the scope of application. In summary, the content of this specification should not be construed as a limitation of the application.

What is claimed is:

1. An organic light-emitting diode (OLED) display panel, comprising:
   a substrate;
   an auxiliary electrode layer disposed on the substrate and comprising an auxiliary cathode, the auxiliary cathode comprising a connecting surface defining a plurality of grooves;
   a pixel definition layer disposed on the auxiliary electrode layer and defining a first opening;
   a plurality of first electrodes spaced apart from each other and disposed in the first opening, and a gap located between the first electrodes and an inner wall of the first opening, wherein the first electrodes are connected to the auxiliary cathode; and
   a cathode disposed on the pixel definition layer and connected to the first electrodes through the first opening;
   wherein one end of each of the first electrodes is disposed in a corresponding one of the grooves of the auxiliary cathode.

2. The OLED display panel of claim 1, further comprising a planarization layer disposed on the auxiliary electrode layer, wherein the pixel definition layer is located on the planarization layer, a second opening is located in the planarization layer and communicates with the first opening, the first electrodes are disposed in the first opening and the second opening, and the cathode is connected to the first electrodes through the first opening and the second opening.

3. The OLED display panel of claim 2, wherein the gap extends between the first electrodes and an inner wall of the second opening.

4. The OLED display panel of claim 1, wherein the auxiliary cathode has a cross section having a homocentric squares-shaped structure, a U-shaped structure, an L-shaped structure, an S-shaped structure, or an O-shaped structure in a thickness direction.

5. The OLED display panel of claim 4, wherein the first electrodes and the auxiliary cathode have a same cross-sectional shape in the thickness direction.

6. The OLED display panel of claim 1, further comprising an anode and an organic light-emitting layer, wherein a third opening is located in the pixel definition layer, the anode is disposed in the third opening, the organic light-emitting layer is disposed on the anode, and the cathode is connected to the organic light-emitting layer through the third opening.

7. The OLED display panel of claim 1, wherein a height of one of the first electrodes is greater than or equal to 20 nanometers.

8. An organic light-emitting diode (OLED) display panel, comprising:
   a substrate;
   an auxiliary electrode layer disposed on the substrate and comprising a plurality of auxiliary cathodes;
   a pixel definition layer disposed on the auxiliary electrode layer and defining a first opening;
   a plurality of first electrodes spaced apart from each other and disposed in the first opening, and a gap located between the first electrodes and an inner wall of the first opening, wherein the first electrodes are connected to the auxiliary cathodes; and a cathode disposed on the pixel definition layer and connected to the first electrodes through the first opening;

wherein each of the auxiliary cathodes is connected to a corresponding one of the first electrodes, one end of each of the auxiliary cathodes protrudes into the first opening, and the corresponding one of the first electrodes encompasses the one end of each of the auxiliary cathodes.

9. The OLED display panel of claim 8, further comprising a planarization layer disposed on the auxiliary electrode layer, wherein the pixel definition layer is located on the planarization layer, a second opening is located in the planarization layer and communicates with the first opening, the first electrodes are disposed in the first opening and the second opening, and the cathode is connected to the first electrodes through the first opening and the second opening.

10. The OLED display panel of claim 9, wherein the gap extends between the first electrodes and an inner wall of the second opening.

11. The OLED display panel of claim 8, wherein the auxiliary cathodes have a cross section having a homocentric squares-shaped structure, a U-shaped structure, an L-shaped structure, an S-shaped structure, or an O-shaped structure in a thickness direction.

12. The OLED display panel of claim 11, wherein the first electrodes and the auxiliary cathodes have a same cross-sectional shape in the thickness direction.

13. The OLED display panel of claim 8, further comprising an anode and an organic light-emitting layer, wherein a third opening is located in the pixel definition layer, the anode is disposed in the third opening, the organic light-emitting layer is disposed on the anode, and the cathode is connected to the organic light-emitting layer through the third opening.

14. The OLED display panel of claim 8, wherein a height of one of the first electrodes is greater than or equal to 20 nanometers.

* * * * *